United States Patent
Iyer et al.

(10) Patent No.: US 8,120,406 B2
(45) Date of Patent: Feb. 21, 2012

(54) SEQUENTIAL CIRCUIT WITH DYNAMIC PULSE WIDTH CONTROL

(75) Inventors: Arun Iyer, Bangalore (IN); Shibashish Patel, Bangalore (IN); Animesh Jain, Bangalore (IN)

(73) Assignee: ATI Technologies ULC, Markham, Ontario (CA)

( * ) Notice: Subject to any disclaimer, the term of this patent is extended or adjusted under 35 U.S.C. 154(b) by 46 days.

(21) Appl. No.: 12/511,608

(22) Filed: Jul. 29, 2009

(65) Prior Publication Data

US 2011/0001535 A1 Jan. 6, 2011

(30) Foreign Application Priority Data

Jul. 6, 2009 (IN) .......................... 1596/CHE/2009

(51) Int. Cl.
  *H03K 3/356* (2006.01)
  *H03K 3/037* (2006.01)
(52) U.S. Cl. ........ 327/212; 327/208; 327/210; 327/211; 327/218; 327/225; 326/93; 326/96; 326/98
(58) Field of Classification Search .......... 327/199–226; 326/93–98
See application file for complete search history.

(56) References Cited

U.S. PATENT DOCUMENTS

| | | | | |
|---|---|---|---|---|
| 5,498,988 A | * | 3/1996 | Reyes et al. | 327/199 |
| 6,204,707 B1 | * | 3/2001 | Hamada et al. | 327/202 |
| 6,822,478 B2 | * | 11/2004 | Elappuparackal | 326/46 |
| 7,420,391 B2 | * | 9/2008 | Pesci | 326/46 |
| 7,443,218 B2 | * | 10/2008 | Onouchi et al. | 327/218 |
| 7,772,905 B2 | * | 8/2010 | Yasuda et al. | 327/202 |
| 7,782,108 B2 | * | 8/2010 | Sedlak | 327/211 |

* cited by examiner

*Primary Examiner* — Patrick O'Neill
(74) *Attorney, Agent, or Firm* — Baker & Daniels LLP

(57) ABSTRACT

A pulsed latch circuit with conditional shutoff prevents an input node, such as a node receiving data, of the pulsed latch circuit, from latching data based on a delayed input control signal, such as an internal clocking signal, and based on a feedback latch state transition detection signal indicating that a current state of input data is stored in the latch. As such, two control conditions are used to shut down the latch. In one example, a condition generator detects when the latch has captured data correctly and outputs a signal to disable the input node. In addition, a variable delay circuit is used to adjust the width of the allowable input signal to set a worst case shutoff time. If data is latched early, a feedback latch state transition detection signal causes the input node to be disabled. If data is not latched early, the maximum allowable latch time is set by the variable delay circuit.

9 Claims, 6 Drawing Sheets

SEQUENTIAL CIRCUIT WITH DYNAMIC PULSE WIDTH CONTROL

BACKGROUND OF THE INVENTION

The invention generally relates to integrated circuits that employ latches or flip-flops, and more particularly to pulsed latch circuits.

Integrated circuits such as microprocessors and other integrated circuits employ combinational logic whose output is latched by flip-flops or latch circuits. The output of a latch circuit then serves as input to other combination logic and so on. In high performance chip designs, it is important for such synchronous designs to minimize the sequential overhead amongst the delays in the combinational logic and the flip-flops. The clock period to the flip-flops is increasingly becoming shorter and shorter to increase the speed of operation of the integrated circuit. As the combinational logic is getting more complex and the latch circuits between them operate on smaller clock pulses, process variations from the manufacturing process, which can increase or vary the hold time required for a latch to latch the incoming data from combinational logic, are becoming problematic. However, as the clock pulse or strobe pulse is narrowed, the resulting silicon can be more susceptible to process variations. The clocking must be set up so that it can allow the combinational logic to perform its functions and provide an output that is latched by the flip-flop.

The latch or registers between the combinational logic need to have their latch delays minimized in order to maximize the speed of operation of the IC. The setup time and hold time require a trade off and a known pulsed latch circuit uses a pulse generator to create a narrow pulse for the latch. An increase in the width of the pulse or strobe can degrade the hold time for the latches. However, attempting to narrow the strobe can result in the collapse of the circuit so there is no clock signal to the registers (flip-flops). Widening the pulse width results in increasing the hold times and causes a chip functional failure, however.

FIG. 1 illustrates one example of a prior art pulsed latch circuit. The prior art pulsed latch circuit 100 employs a pulse generator 102 that includes a variable delay circuit 104 that receives an input clock signal 106 and generates a strobe signal 108. The variable delay circuit 104 controls the width of the strobe signal 108. An input node 110 receives the incoming signal to be latched from combinational logic and an output node 112 provides the latched output signal to other combinational logic. The pulsed flip-flop 100 includes a keeper circuit 114 that retains the state of the flop when the clock signal is inactive. The transmission gate circuit 118 includes a transmission gate 120, inverter 122 and inverter 124 connected as shown. The transmission gate output node 126 is the latched input signal from input node 110. A problem arises when a very narrow pulse is provided by the pulse generator in order to meet speed requirements since the response to the various circuit components may be affected by process variations in the manufacturing process. Changing the variable delay to increase the pulse width makes the hold time of the flop or register very large so for short paths within a circuit in a sequential arrangement, where the data is arriving very early, having the hold time too large can unnecessarily increase the padding or waiting time between sequential sections and slow down the performance speed of the integrated circuit unnecessarily.

Accordingly, a need exists for an improved pulsed latch circuit.

BRIEF DESCRIPTION OF THE DRAWINGS

The invention will be more readily understood in view of the following description when accompanied by the below figures and wherein like reference numerals represent like elements, wherein.

DETAILED DESCRIPTION OF THE PREFERRED EMBODIMENTS

Figure 1:
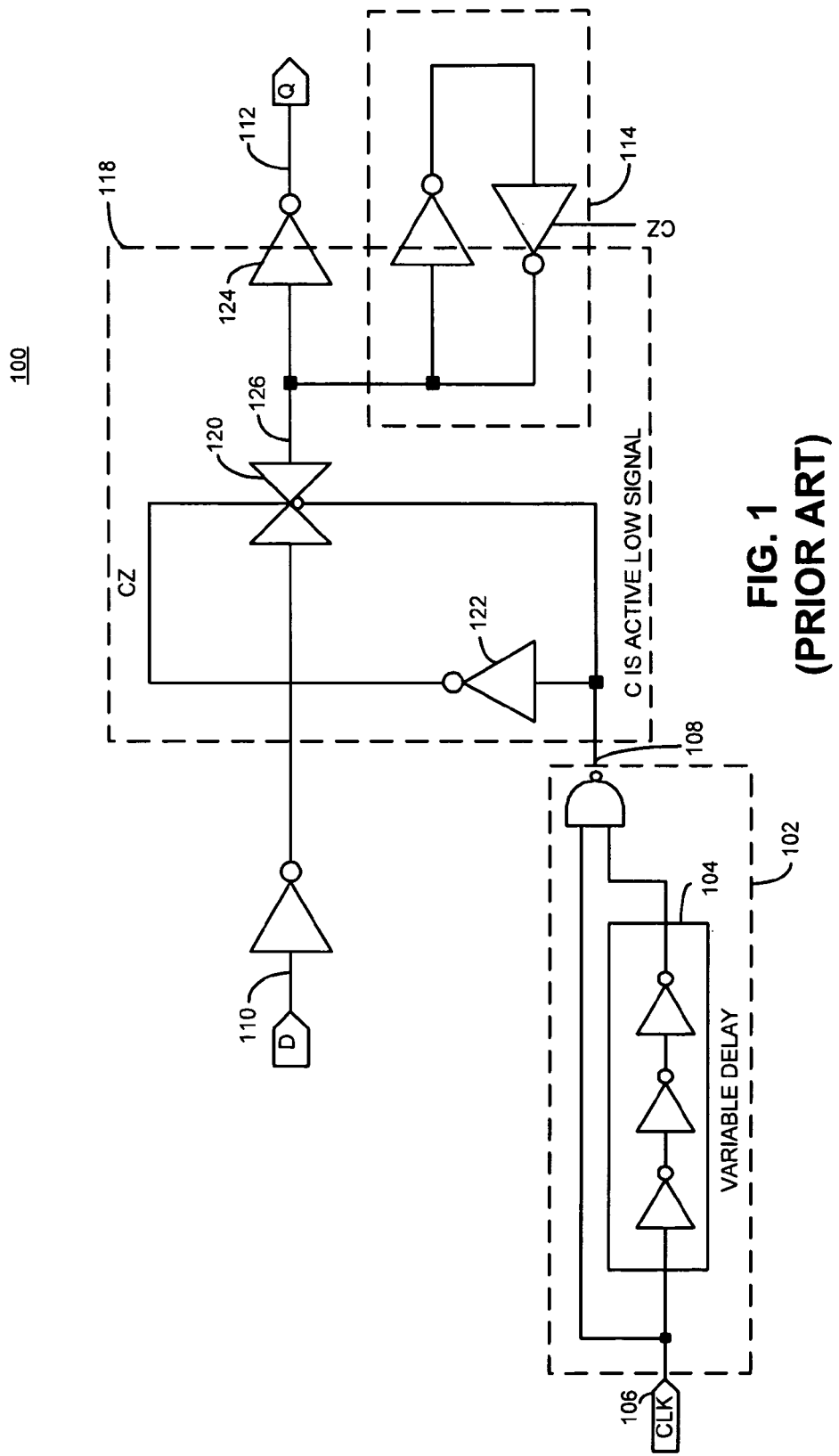
FIG. 1 is a circuit diagram illustrating one example of a prior art pulsed latch circuit.

Generally, a pulsed latch circuit with conditional shutoff prevents an input node, such as a node receiving data, of the pulsed latch circuit, from latching data based on a delayed input control signal, such as an internal clocking signal, and based on a feedback latch state transition detection signal indicating that a current state of input data is stored in the latch. As such, two control conditions are used to shut down the latch. In one example, a condition generator detects when the latch has captured data correctly and outputs a signal to disable the input node. In addition, a variable delay circuit is used to adjust the width of the allowable input signal to set a worst case shutoff time. If data is latched early, a feedback latch state transition detection signal causes the input node to be disabled. If data is not latched early, the maximum allowable latch time is set by the variable delay circuit.

Stated another way, the condition generator logic disables the input node when the feedback latch state transition detection signal indicates that a current state of input data is stored before an end of time period defined by the delayed input control signal and the condition generator logic also disables the input node when an end of time period defined by the delayed input control signal is provided by the variable delay circuit, occurs independently of a signal level of the feedback flop state transition detect signal.

In one embodiment, feedback latch state detection logic produces the feedback latch state transition detection signal and includes a transmission gate having an input coupled to a delayed latch output node and an output coupled to a latch output node. An XOR circuit has inputs operatively coupled to the input and output of the transmission gate and an output operatively coupled to the condition generator logic. The logic detects when data has been properly latched.

The circuitry may be represented by hardware descriptor language code stored on computer readable storage products such as CDs, DVDs, optical disks, distributed memory in Internet servers, or any other suitable computer readable storage medium. An integrated circuit design systems including one or more processors may execute the executable instructions from the computer readable storage product and lay out a circuit die that includes the pulsed latch circuit with conditional shutoff as described above.

Among other advantages, the disclosed pulsed latch circuit with conditional shutoff creates a suitable timing window in which to receive input data. In the case where input data is available to the flip-flop early the flip-flop does not wait until the end of the timing window to latch but instead the flip-flop is switched off once the data is correctly captured by the flip-flop. Such operation can make the latch circuit (e.g., register) less prone to process variation and allow a suitable tradeoff between setup time and hold time for the flip-flop. Other advantages will be recognized by those of ordinary skill in the art.

Figure 2:
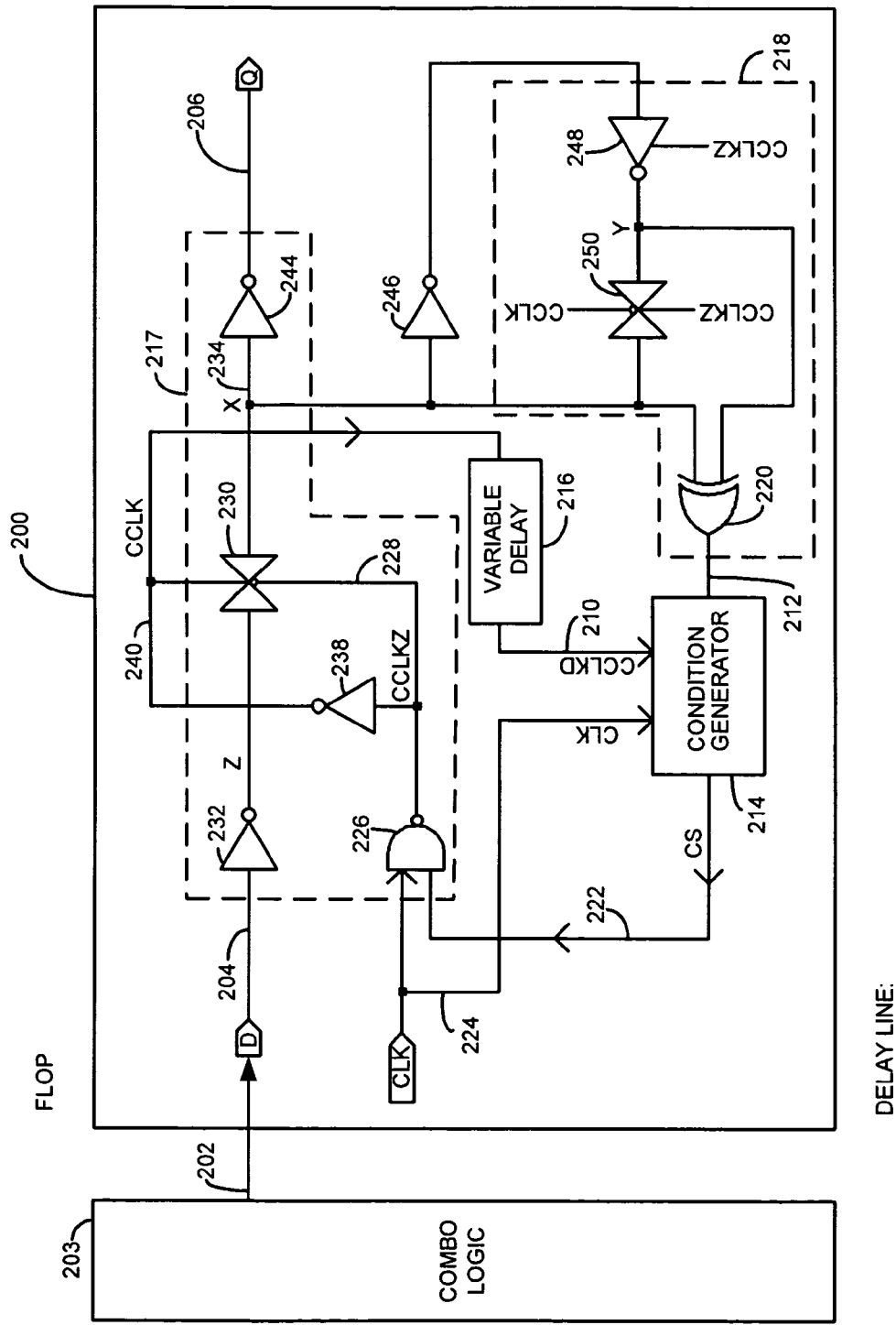
FIG. 2 illustrates one example of an integrated circuit employing a pulsed latch circuit in accordance with one example set forth in the disclosure.

FIG. 2 is a circuit and block diagram illustrating one example of a pulsed latch circuit 200 with conditional shutoff in accordance with one example. The pulsed latch circuit 200 receives input data 202 at input node 204 from combination logic 203. The latched output data 206 is provided as input to other combinational logic (not shown). The pulsed latch circuit 200 with conditional shutoff is operative to prevent the input node 204 or node Z of the pulsed latch circuit from latching data based on a delayed input control signal 210 and based on a feedback latch state transition detection signal 212 indicating that a current state of input data at node X is stored. The pulsed latch circuit 200 with conditional shutoff includes condition generator logic 214, variable delay logic 216, feedback latch state detection logic 218 and latch logic 217. It will be recognized that the dashed lines are merely designation for purposes of illustration and that the differing circuit components may be considered part of other functional blocks. For example, the condition generator logic 214 may be considered to include the XOR circuit 220 or any other suitable structure shown.

The condition generator 214 generates a clock disable signal 222 based on the input clock signal 224, the delayed input control signal 210 and the feedback latch state transition detection signal 212. A NAND gate 226 outputs an internal clock (CCLKZ) 228 which serves as a clocking signal to the transmission gate 230. Transmission gate 230 receives from inverter 232 input data 202 and outputs latched data 234 at node X. An inverter 238 outputs another internal clock signal (CCLK) 240. The variable delay logic 216 receives the internal clock signal 240 and outputs the delayed input control signal 210. The latched data 234 is output at node 206 after being inverted by inverter 244. Inverters 246 and 248 provide the latched data to an input of a transmission gate 250 and the feedback latch state detection logic 218. The transmission gate 250 is coupled to node X at its output and is also operatively coupled to the input of the XOR 220. Another input of the XOR gate receives the delayed latched output data at node Y. The node X is considered to be a latched output node. The node Y is considered to be a delayed latched output node.

Figure 3:
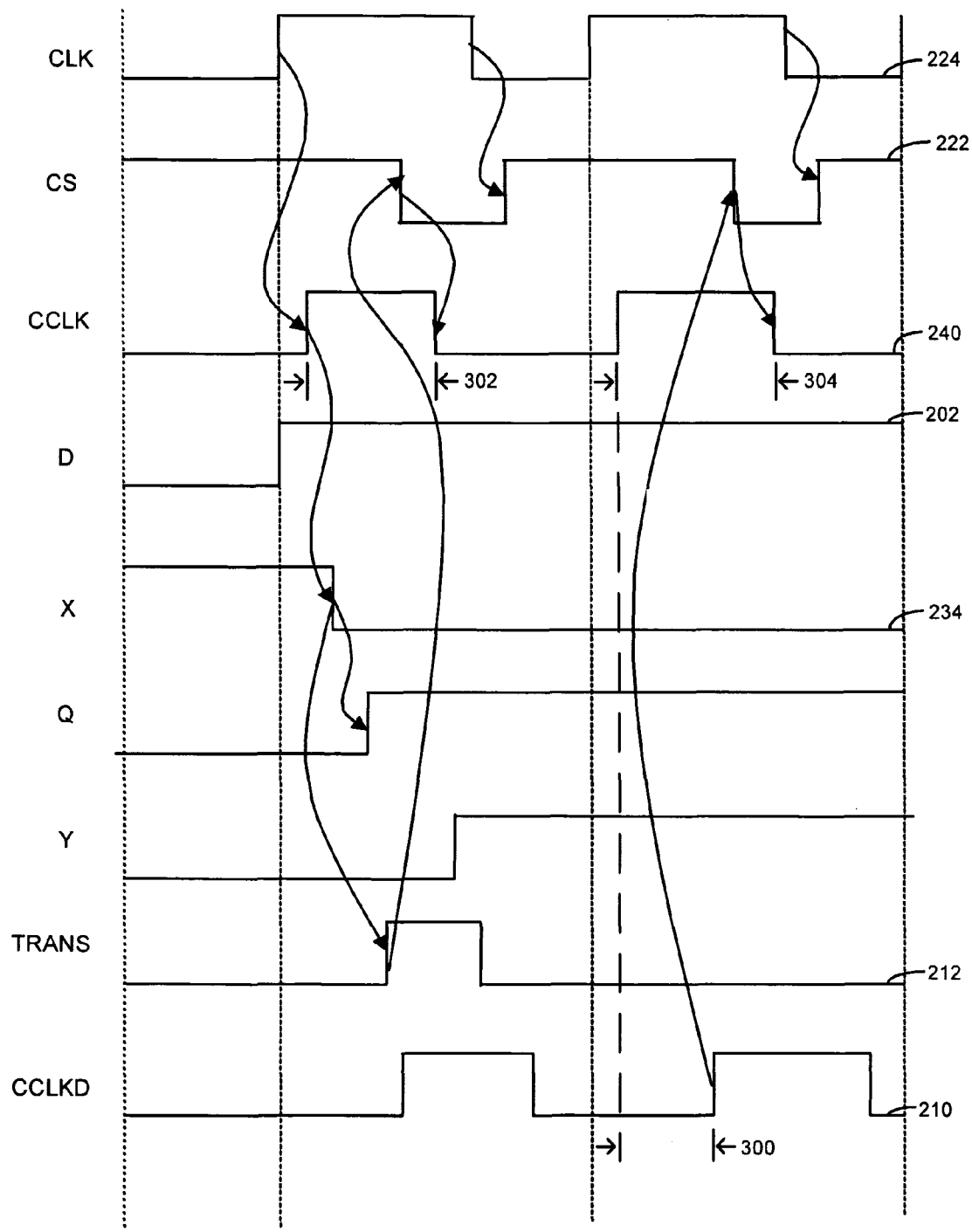
FIG. 3 is a timing diagram illustrating one example of the operation of the pulsed latch circuit shown in FIG. 2.

Referring also to FIG. 3, in operation, at the start of every cycle, the clock disable signal 222 goes high and on the arrival of the input clock signal 224 rising edge, the signal CCLK 240 goes high. Internal clock signal 240 acts as an internal clock to the latch. Once node X captures the new data received on the input node 204, a transition is detected and the feedback latch state transition detection signal 212 goes high. This indicates a proper latching of data. The feedback latch state transition detection signal 212 is fed to the condition generator logic indicating a proper latching of the data and signaling to shutoff the latch by outputting the clock disable signal to go low indicating the clock to be shutoff and this causes the CCLK signal 240 to go low shutting off the latch (when the feedback latch state transition detection signal 212 goes high, the clock disable signal goes low).

Once the internal clock 240 goes low, the node Y is updated with the new value of data. The feedback latch state transition detection signal 212 then goes low. The latch once shutoff cannot be opened until the next clock cycle. This guarantees a flop-like operation of the circuit.

Once the input clock goes low, the condition generator logic generates a high value of the clock disable signal. This indicates the latch circuit is ready to receive a fresh value of data at the start of the next clock cycle on the input node 204. This brings the latch circuit to the state to allow to receive data.

On the next clock cycle, when the input clock signal 224 goes high, in the instance where the D input or input node 204 does not get updated, the latch circuit shuts off. The latch circuit shutting off is controlled by the delayed input control signal 210. The delayed input control signal 210 is basically a delayed CCLK input clock signal 240. The variable delay logic 216 controls this delay. This delay is programmable either during a design phase based on actually design constraints such as the slew of the clock signal 224, performance requirements, process margins and other variabilities as desired. Alternatively, the variable delay logic may be programmable at startup of the integrated circuit or at any other suitable time. The variable delay logic allows a smooth tradeoff between setup time and hold time of the pulsed latch circuit.

It is desirable that the circuit paths generating the feedback latch state transition detection signal 212 is designed to be as fast as possible and the path generating the delayed input control signal 210 can be adjusted during the design phase if desired.

Referring again to FIG. 3, as shown the CCLK is controlled to have differing pulse widths 302 and 304. Pulse width 302 is controlled to be a pulse width in case the data transition controlled by either the variable delay block or the Trans signal. The pulse width 304 is provided in the case of no data transition detected and is controlled by the variable delay block only. The variable delay time 300 sets the limit on the value of the maximum hold time for the latch.

Figure 4:
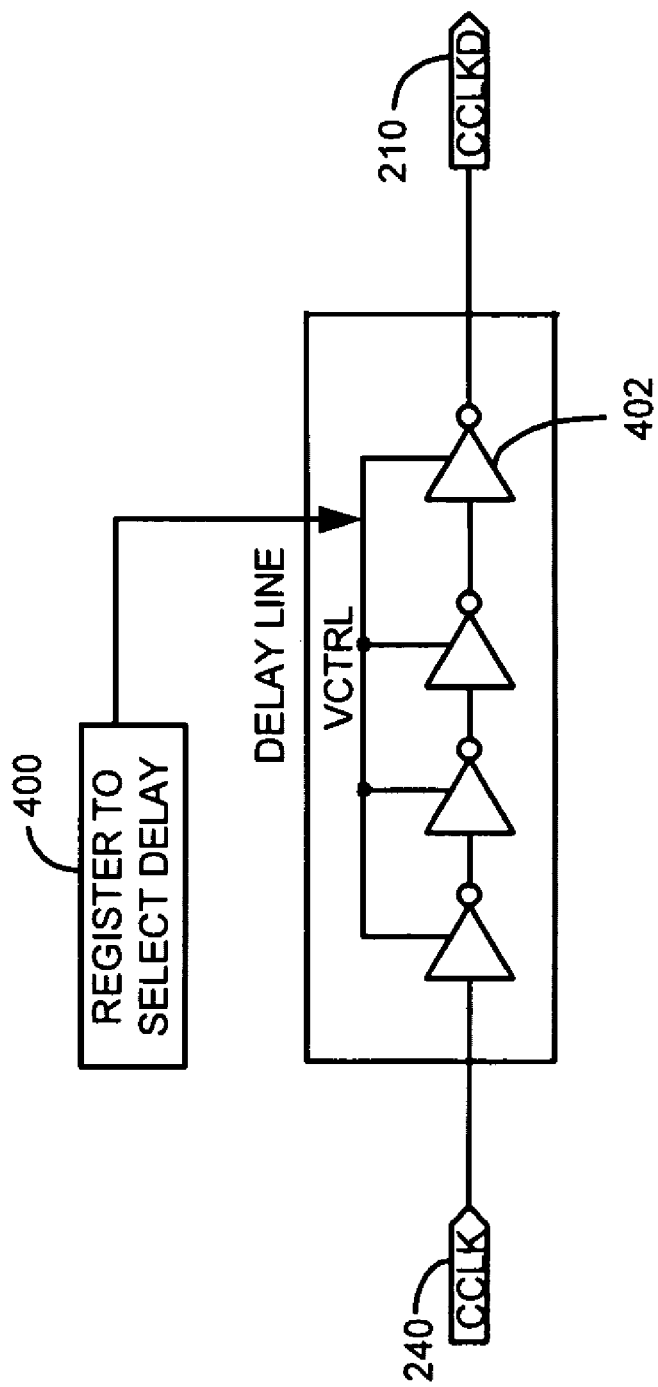
FIG. 4 is a block diagram illustrating one example of the adjustable variable delay circuit shown in FIG. 2.

FIG. 4 illustrates one example of the variable delay lock including a register 400 that can be programmed to select the amount of delay or inverters that are connected in series. The delay line may be a series of inverters generally shown 402. It may be desirable to use an even number of inverter stages however any configuration may be used if applicable.

Figure 5:
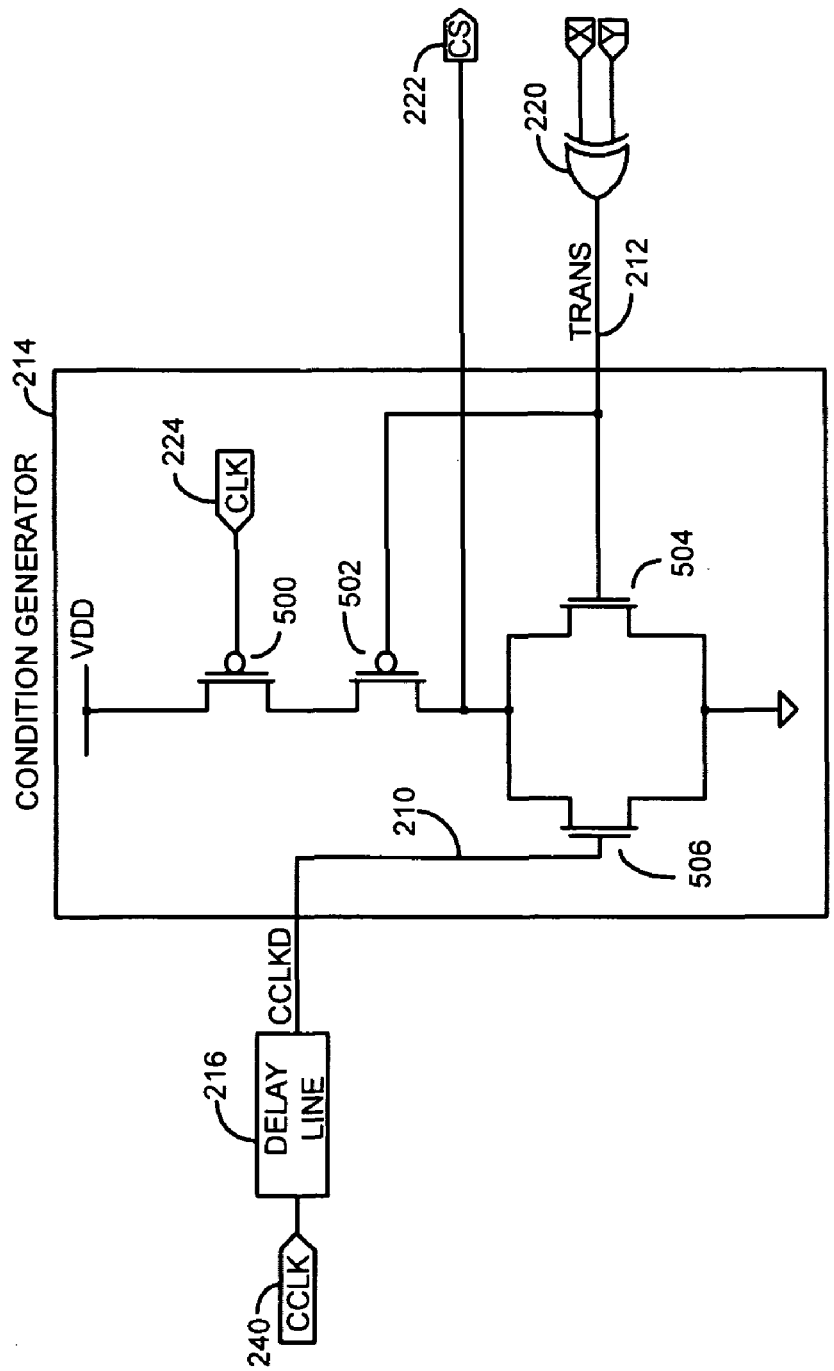
FIG. 5 is a circuit diagram illustrating one example of a condition generator circuit shown in FIG. 2.

FIG. 5 is a circuit diagram of the condition generator logic and illustrates a pair of PMOS transistors 500 and 502 connected in a cascode arrangement and a plurality of NMOS transistors 504 and 506 wherein transistor 504 has an input that receives the Trans signal and the NMOS transistor 506 receives the delayed control signal CCLKD. PMOS transistor 502 has a terminal that is connected to terminals common to the NMOS transistors 504 and 506 as shown.

Figure 6:
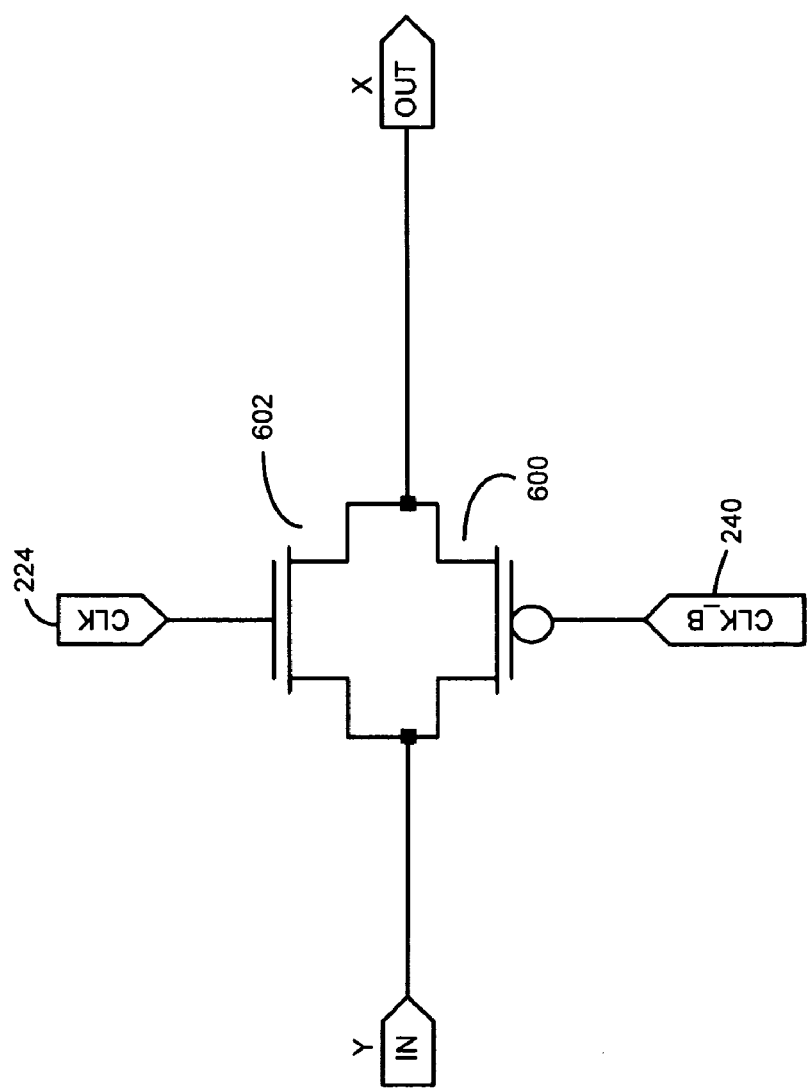
FIG. 6 is one example of a transmission gate used in the circuit of FIG. 2.

FIG. 6 illustrates one embodiment of a transmission gate that may be employed. It will be recognized however, that any suitable circuitry may be employed for the blocks and logic indicated. The transmission gate is a PMOS transistor 600 and NMOS transistor 602 are operatively coupled as shown.

The disclosed pulsed latch circuit with conditional shutoff creates a suitable timing window in which to receive input data. In the case where input data is available to the flip-flop early the flip-flop does not wait until the end of the timing window to latch but instead the flip-flop is switched off once the data is correctly captured by the flip-flop. Such operation can make the latch circuit (e.g., register) less prone to process variation and allow a suitable tradeoff between setup time and hold time for the flip-flop. Other advantages will be recognized by those of ordinary skill in the art.

Also, integrated circuit design systems (e.g. work stations) are known that create integrated circuits based on executable instructions stored on a computer readable memory such as but not limited to CDROM, RAM, other forms of ROM, hard drives, distributed memory etc. The instructions may be represented by any suitable language such as but not limited to hardware descriptor language or other suitable language. As such, the logic (e.g., circuits) described herein may also be produced as integrated circuits by such systems.

The above detailed description of the invention and the examples described therein have been presented for the purposes of illustration and description only and not by limitation. It is therefore contemplated that the present invention cover any and all modifications, variations or equivalents that fall within the spirit and scope of the basic underlying principles disclosed above and claimed herein.

What is claimed is:

1. An integrated circuit (IC) comprising:
   a pulsed latch circuit with conditional shut-off operative to prevent an input node of the pulsed latch circuit from latching data based on a delayed input control signal and based on a feedback latch state transition detection signal indicating that a current state of input data is stored; and
   wherein the pulsed latch circuit with conditional shut-off comprises an input node and condition generator logic that is operative to disable the input node when (a) the feedback latch state transition detection signal indicates that a current state of input data is stored before an end of time period defined by the delayed input control signal and when (b) an end of time period defined by the delayed input control signal occurs independently of a signal level of the feedback latch state transition detection signal.

2. The IC of claim 1 wherein the condition generator logic is operative to generate a clock disable signal based on an input clock signal the feedback latch state transition detection signal and the delayed input control signal.

3. The IC of claim 1 wherein the pulsed latch circuit with conditional shut-off comprises feedback latch state detection logic that comprises a transmission gate having an input operatively coupled to a delayed latched output node and an output operatively coupled to a latched output node and an XOR having inputs operatively coupled to the input and output of the transmission gate and an output operatively coupled to the condition generator logic.

4. The IC of claim 2 comprising an internal latch clock generator circuit operative to generate an internal latch clock based on the input clock and a delay circuit having an input coupled to the internal latch clock and operative to generate the delayed input control signal based on the internal latch clock.

5. An integrated circuit (IC) comprising:
   a pulsed latch circuit with conditional shut-off operative to prevent an input node of the pulsed latch circuit from latching data based on a delayed input control signal and based on a feedback latch state transition detection signal indicating that a current state of input data is stored; and comprising condition generator logic comprising:
   a first and second PMOS transistor in a cascode configuration wherein a gate of the first PMOS transistor is operatively responsive to an input clock signal and the gate of the second PMOS transistor is operatively responsive to the feedback latch state transition detection signal; and
   a first and second NMOS transistor having respective sources coupled to each other and coupled to the second PMOS transistor, and wherein the gate of the first NMOS transistor is operatively responsive to the delayed input control signal and the gate of the second NMOS transistor is responsive to the feedback latch state transition detection signal.

6. The IC of claim 5 wherein the condition generator logic is operative to generate a clock disable signal based on an input clock signal the feedback latch state transition detection signal and the delayed input control signal.

7. The IC of claim 5 wherein the pulsed latch circuit with conditional shut-off comprises feedback latch state detection logic that comprises a transmission gate having an input operatively coupled to a delayed latched output node and an output operatively coupled to a latched output node and an XOR having inputs operatively coupled to the input and output of the transmission gate and an output operatively coupled to the condition generator logic.

8. The IC of claim 7 comprising an internal latch clock generator circuit operative to generate an internal latch clock based on the input clock and a delay circuit having an input coupled to the internal latch clock and operative to generate the delayed input control signal based on the internal latch clock.

9. A non-transitory computer readable storage medium comprising:
   executable instructions that when executed by one or more processors, causes an integrated circuit design system to layout an integrated circuit die that comprises:
   a pulsed latch circuit with conditional shut-off operative to prevent an input node of the pulsed latch circuit from latching data based on a delayed input control signal and based on a feedback latch state transition detection signal indicating that a current state of input data is stored, and
   wherein the pulsed latch circuit with conditional shut-off comprises an input node and condition generator logic that is operative to disable the input node when (a) the feedback latch state transition detection signal indicates that a current state of input data is stored before an end of time period defined by the delayed input control signal and when (b) an end of time period defined by the delayed input control signal occurs independently of a signal level of the feedback latch state transition detection signal.

* * * * *